(12) United States Patent
Sumiya et al.

(10) Patent No.: US 7,525,131 B2
(45) Date of Patent: Apr. 28, 2009

(54) PHOTOELECTRIC SURFACE AND PHOTODETECTOR

(75) Inventors: Masatomo Sumiya, Tsukuba (JP);
Shunro Fuke, Hamamatsu (JP);
Tokuaki Nihashi, Hamamatsu (JP);
Minoru Hagino, Hamamatsu (JP)

(73) Assignees: National University Corporation Shizuoka University, Shizuoka-shi, Shizuoka (JP); Hamamatsu Photonics K.K., Hamamatsu-shi, Shizuoka (JP)

( * ) Notice: Subject to any disclaimer, the term of this patent is extended or adjusted under 35 U.S.C. 154(b) by 15 days.

(21) Appl. No.: 11/511,497

(22) Filed: Aug. 29, 2006

(65) Prior Publication Data
US 2007/0132050 A1    Jun. 14, 2007

(30) Foreign Application Priority Data
Dec. 12, 2005  (JP) .......................... P2005-358050

(51) Int. Cl.
| | |
|---|---|
| H01L 29/732 | (2006.01) |
| H01L 31/0328 | (2006.01) |
| H01L 31/0336 | (2006.01) |
| H01L 31/072 | (2006.01) |
| H01L 31/109 | (2006.01) |
| H01L 29/06 | (2006.01) |
| H01L 29/12 | (2006.01) |
| H01L 29/04 | (2006.01) |
| H01L 29/10 | (2006.01) |
| H01L 31/036 | (2006.01) |
| H01L 31/0376 | (2006.01) |
| H01L 31/20 | (2006.01) |
| H01L 27/15 | (2006.01) |
| H01L 33/00 | (2006.01) |
| H01L 29/74 | (2006.01) |
| H01L 31/062 | (2006.01) |
| H01L 31/00 | (2006.01) |

(52) U.S. Cl. .................... 257/184; 257/10; 257/11; 257/14; 257/21; 257/22; 257/53; 257/54; 257/55; 257/56; 257/80; 257/81; 257/82; 257/83; 257/84; 257/85; 257/94; 257/96; 257/113; 257/114; 257/115; 257/116; 257/117; 257/118; 257/185; 257/186; 257/187; 257/188; 257/189; 257/225; 257/257; 257/258; 257/290; 257/291; 257/292; 257/293; 257/294; 257/431; 257/451; 257/461

(58) Field of Classification Search ............ 257/10–11, 257/21, 53–56, 80–85, 113–118, 184–189, 257/225, 257–258, 290–294, 431, 451, 461
See application file for complete search history.

(56) References Cited

U.S. PATENT DOCUMENTS
5,815,520 A * 9/1998 Furushima ............... 372/45.01
(Continued)

FOREIGN PATENT DOCUMENTS
JP      10-241554     9/1998

OTHER PUBLICATIONS

Masatomo Sumiya, et al., The 2005-2006 Term Research Project Overview, Innovative Joint Research Center, Shizuoka University, School of Unexplored Technology Development, Aug. 31, 2005, 3 pages (with English-language translation attached).

(Continued)

*Primary Examiner*—Ida M Soward
(74) *Attorney, Agent, or Firm*—Drinker Biddle & Reath LLP

(57) ABSTRACT

Disclosed is a photoelectric surface including: a first group III nitride semiconductor layer that produces photoelectrons according to incidence of ultraviolet rays; and a second group III nitride semiconductor layer provided adjacent to the first group III nitride semiconductor layer and made of a thin-film crystal having c-axis orientation in a thickness direction, the second group III nitride semiconductor layer having an Al composition higher than that of the first group III nitride semiconductor layer.

10 Claims, 10 Drawing Sheets

U.S. PATENT DOCUMENTS

| | | | |
|---|---|---|---|
| 6,225,650 B1 * | 5/2001 | Tadatomo et al. | 257/190 |
| 6,242,761 B1 * | 6/2001 | Fujimoto et al. | 257/94 |
| 6,492,669 B2 * | 12/2002 | Nakayama et al. | 257/282 |
| 6,580,215 B2 | 6/2003 | Nihashi | 313/542 |
| 6,583,690 B2 * | 6/2003 | Lee et al. | 333/193 |
| 688,867 A1 * | 5/2005 | Sawaki et al. | 372/46.01 |
| 7,199,408 B2 * | 4/2007 | Miyoshi | 257/194 |
| 7,447,248 B2 * | 11/2008 | Miyajima et al. | 372/45.01 |
| 2005/0236710 A1 * | 10/2005 | Akiyama et al. | 257/744 |
| 2005/0248238 A1 * | 11/2005 | Yamada et al. | 310/366 |
| 2006/0001508 A1 * | 1/2006 | Ohara et al. | 333/191 |
| 2006/0043396 A1 * | 3/2006 | Tsuda et al. | 257/94 |
| 2006/0051554 A1 * | 3/2006 | Kumakura et al. | 428/98 |
| 2006/0138431 A1 * | 6/2006 | Dwilinski et al. | 257/79 |
| 2006/0202215 A1 * | 9/2006 | Wierer et al. | 257/94 |
| 2007/0101932 A1 * | 5/2007 | Schowalter et al. | 117/952 |
| 2007/0158692 A1 * | 7/2007 | Nakayama et al. | 257/213 |

OTHER PUBLICATIONS

Masatomo Sumiya, et al., Development of Photo Cathode by Utilizing the Polar Structure of III-V Nitride Film, Shizuoka University, 26p-ZF-4, 2006—Musashi Institute of Technology Mar. 26, 2006 (with English-language translation attached).

Masatomo Sumiya, et al., Development of Transparent Short Wave Photocathode Using Polar Structure of Nitride Film, Jun. 2006, (with English-language translation attached).

\* cited by examiner

PHOTOELECTRIC SURFACE AND PHOTODETECTOR

BACKGROUND OF THE INVENTION

1. Field of the Invention

The present invention relates to a photoelectric surface including a group III nitride semiconductor layer and a photodetector using the same.

2. Related Background Art

A photoelectric surface including a GaN layer as an active layer has been known (see Japanese Published Unexamined Patent Application No. H10-241554). In the photoelectric surface, when ultraviolet rays are made incident into the GaN layer, photoelectrons are emitted from the GaN layer.

SUMMARY OF THE INVENTION

Even in the aforementioned photoelectric surface, quantum efficiency when the GaN layer emits photoelectrons has been improved, however, a further improvement in quantum efficiency of the active layer has been demanded.

It is an object of the present invention to provide a photoelectric surface that is high in quantum efficiency and a photodetector using the same.

In order to solve the above-mentioned problems, a photoelectric surface according to the present invention includes: a first group III nitride semiconductor layer that produces photoelectrons according to incidence of ultraviolet rays; and a second group III nitride semiconductor layer provided adjacent to the first group III nitride semiconductor layer and made of a thin-film crystal having c-axis orientation in a thickness direction, the second group III nitride semiconductor layer having an Al composition higher than that of the first group III nitride semiconductor layer.

Here, the first group III nitride semiconductor layer may or may not contain Al.

A photoelectric surface according to the present invention includes: a first group III nitride semiconductor layer that produces photoelectrons according to incidence of ultraviolet rays; and a second group III nitride semiconductor layer provided adjacent to the first group III nitride semiconductor layer and polarized in a thickness direction.

A photodetector according to the present invention includes: the photoelectric surface; and an anode for extracting photoelectrons emitted from the photoelectric surface as an output signal.

DESCRIPTION OF THE PREFERRED EMBODIMENTS

Hereinafter, embodiments of the present invention will be described in detail with reference to the accompanying drawings. Here, in the description of the drawings, identical or equivalent elements are designated with identical numerical symbols so as to avoid overlapping descriptions.

First Embodiment

Figure 1:
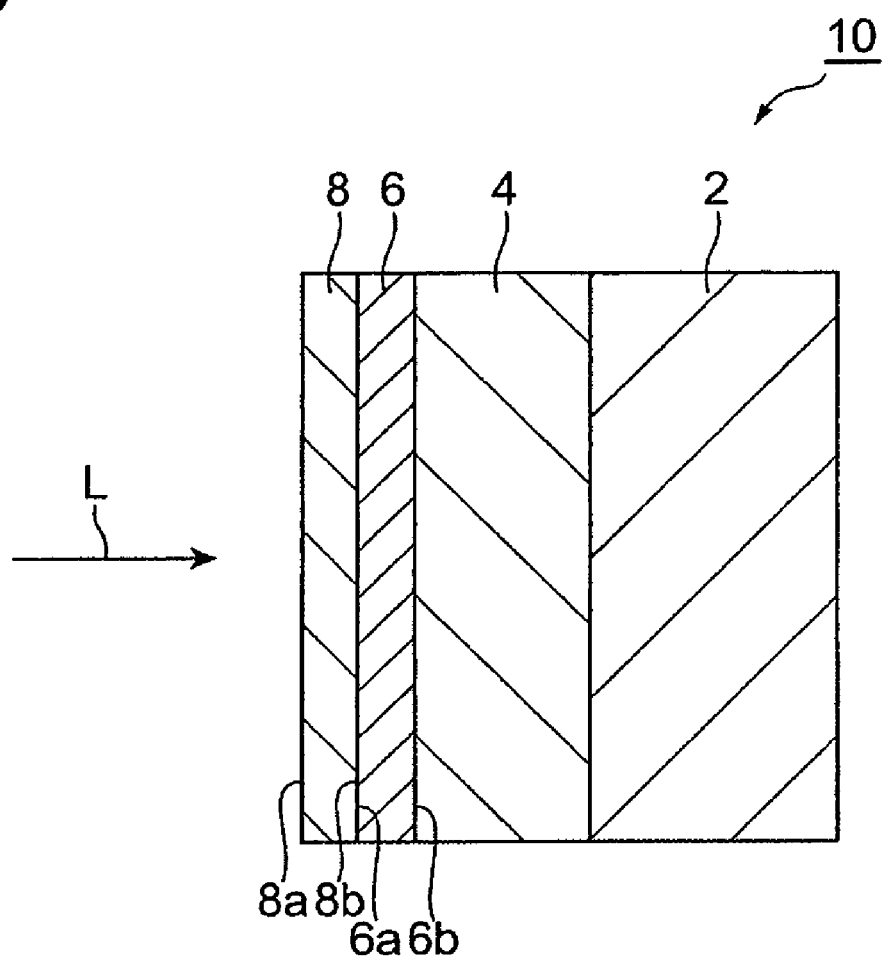
FIG. 1 is a sectional view schematically showing a photoelectric surface according to a first embodiment.
Figure 2:
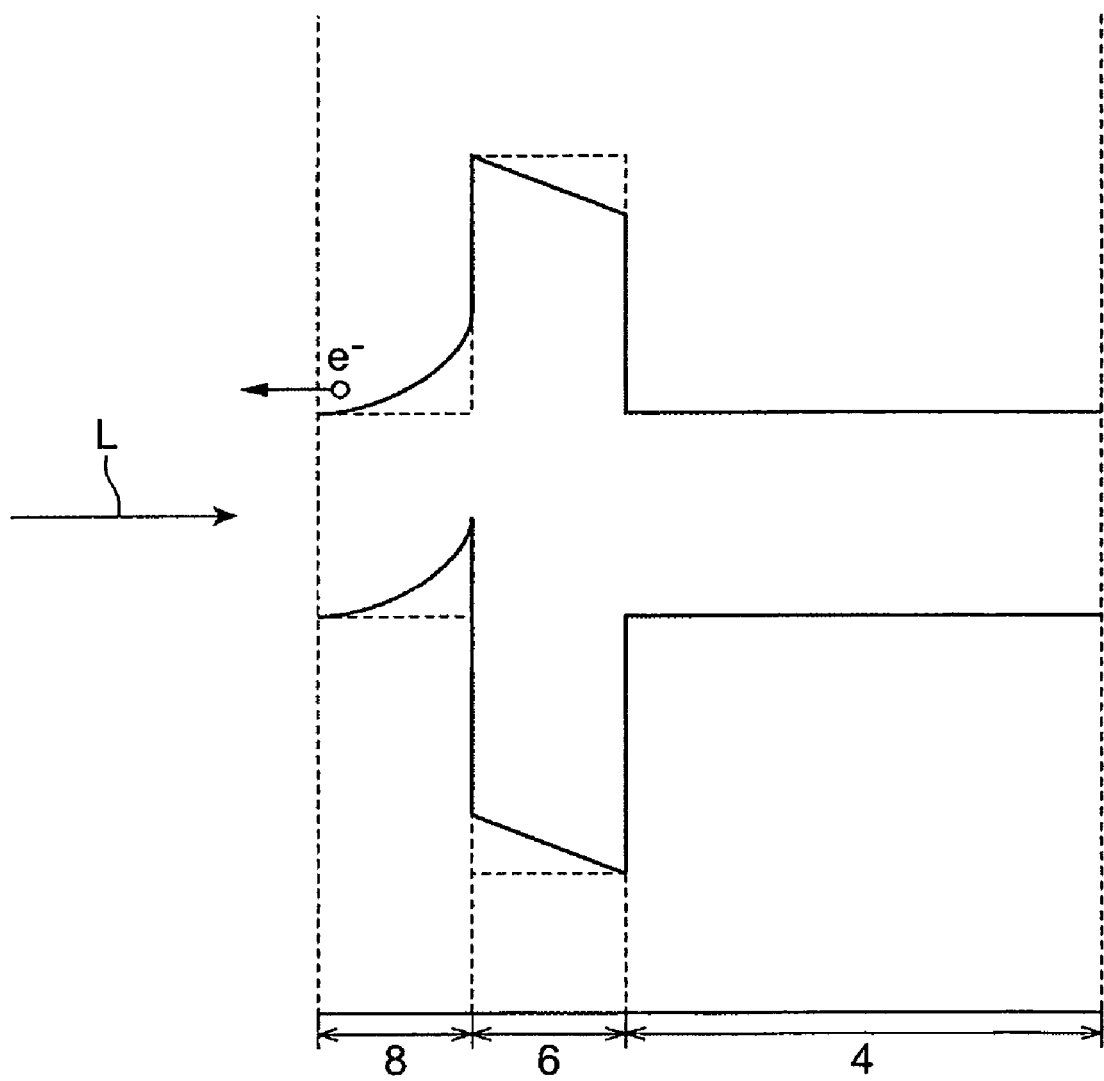
FIG. 2 shows a band model of the photoelectric surface shown in FIG. 1.

FIG. 1 is a sectional view schematically showing a photoelectric surface according to a first embodiment. FIG. 2 shows a band model of the photoelectric surface shown in FIG. 1. In FIG. 1, a reflective photoelectric surface 10 is shown. The photoelectric surface 10 includes a first group III nitride semiconductor layer (active layer) 8 that produces photoelectrons according to incidence of ultraviolet rays L and a second group III nitride semiconductor layer 6 provided adjacent to the group III nitride semiconductor layer 8. It is preferable that the group III nitride semiconductor layer 6 has a heterojunction with the group III nitride semiconductor layer 8.

It is preferable that the photoelectric surface 10 further includes a third group III nitride semiconductor layer 4. The group III nitride semiconductor layer 4 preferably contains Ga, and may contain Al, In, or the like. The group III nitride semiconductor layer 4 is, for example, $Al_xGa_{1-x}N$ ($0 \leq x < 1$). It is preferable that the group III nitride semiconductor layer 4 is provided on a substrate 2. As the substrate 2, for example, a Si (111) substrate, a sapphire substrate, or the like having a thickness of 200 to 300 μm can be mentioned. The group III nitride semiconductor layer 6 is provided on the group III nitride semiconductor layer 4.

The group III nitride semiconductor layer 6 is made of a thin-film crystal having c-axis orientation in a thickness direction (crystal growth direction) and has an Al composition higher than that of the group III nitride semiconductor layer 8. The group III nitride semiconductor layer 6 has a first surface 6a and a second surface 6b. When the surface 6a is a +c surface (a surface in a positive c-polarity direction, a group III element surface forming compounds with nitrides), the surface 6b is a −c surface (a surface in a negative c-polarity direction, an N surface). When the surface 6a is a −c surface, the surface 6b is a +c surface.

The group III nitride semiconductor layer 6 is polarized in the thickness direction. It is preferable that a spontaneous polarization coefficient (for example, 0.09 $C/m^2$ with AlN) of the group III nitride semiconductor layer 6 is greater than that (for example, 0.034 $C/m^2$ with GaN) of the group III nitride semiconductor layer 8. Moreover, it is preferable that an energy band gap of the group III nitride semiconductor layer 6 is greater than that of the group III nitride semiconductor layer 8. Thereby, absorption of the ultraviolet rays L in the group III nitride semiconductor layer 6 can be prevented. If the Al composition of the group III nitride semiconductor layer 6 is increased, spontaneous polarization is enhanced and the energy band gap is also increased.

Since the group III nitride semiconductor layer 6 has the aforementioned configuration, an internal electric field occurs in the group III nitride semiconductor layer 6. The internal electric field occurs due to the above-mentioned spontaneous polarization of the group III nitride semiconductor layer 6 or a piezoelectric field caused by distortion (a distortion due to a tensile stress or a compressive stress) of the group III nitride semiconductor layer 6. The internal electric field resulting from spontaneous polarization reaches, for example, a few MV/cm. The distortion of the group III nitride semiconductor layer 6 occurs due to, for example, a difference in a lattice constant from the group III nitride semiconductor layer 4. If distortion polarization of the group III nitride semiconductor layer 6 increases, the internal electric field is also increased. The internal electric field concentrates in the vicinity of an interface between the group III nitride semiconductor layer 6 and group III nitride semiconductor layer 8 (a surface 8b of the group III nitride semiconductor layer 8 to be described later) due to a surface level.

The group III nitride semiconductor layer 6 preferably contains Ga, and may contain Al, In, or the like. The group III nitride semiconductor layer 6 is made from, for example, $Al_yGa_{1-y}N$ ($0<y\leq1$). The conductivity type of the group III nitride semiconductor layer 6 may be any of an n-type, a p-type, and i-type. It is preferable that the group III nitride semiconductor layer 6 is made from a material different from that of the group III nitride semiconductor layer 4. In this case, by selecting an appropriate material, distortion polarization of the group III nitride semiconductor layer 6 can be controlled.

It is preferable that the thickness of the group III nitride semiconductor layer 6 is 3 to 100 nm. If the thickness of the group II nitride semiconductor layer 6 is less than 3 nm, crystallinity and flatness tend to be lowered. On the other hand, if the thickness of the group III nitride semiconductor layer 6 is more than 100 nm, the internal electric field of the group III nitride semiconductor layer 6 tends to be reduced.

The group III nitride semiconductor layer 8 preferably contains Ga, and may contain Al, In, or the like. When the group III nitride semiconductor layer 8 contains Al, by controlling the Al composition ratio, ultraviolet rays in a desired wavelength region of the ultraviolet rays L can be cut off. When the group III nitride semiconductor layer 8 contains In, the photoelectric surface 10 is favorably used for a sensor of long wavelength-side ultraviolet rays of the ultraviolet rays L. It is preferable that the group III nitride semiconductor layer 8 is made of a thin-film crystal. The conductivity type of the group III nitride semiconductor layer 8 may be either the n-type or p-type, and is preferably the same as the conductivity type of the group III nitride semiconductor layer 6. When the group III nitride semiconductor layer 8 contains Mg, a p-type group III nitride semiconductor layer 8 is obtained.

The group III nitride semiconductor layer 8 has a first surface 8a and a second surface 8b. It is preferable that the surface 8a is a −c surface (a surface in a negative c-polarity direction, an N surface). Thereby, photoelectrons are easily emitted from the group III nitride semiconductor layer 8. In this case, the surface 8b is a +c surface (a surface in a positive c-polarity direction, a group III element surface forming compounds with nitrides). When the surface 8a is a +c surface, the surface 8b is a −c surface.

It is preferable that the thickness of the group III nitride semiconductor layer 8 is 100 to 200 nm. If the thickness of the group III nitride semiconductor layer 8 is less than 100 nm, since crystal quality of the group III nitride semiconductor layer 8 is deteriorated, a quantum efficiency-enhancing effect tends to be lowered. On the other hand, if the thickness of the group III nitride semiconductor layer 8 is more than 200 nm, since the energy band is flattened by an increase in the number of carriers in the group III nitride semiconductor layer 8, a quantum efficiency-enhancing effect tends to be lowered.

It is preferable that the carrier concentration of the group III nitride semiconductor layer 8 is $1\times10^5$ to $1\times10^{19}$ cm$^{-3}$. If the carrier concentration of the group III nitride semiconductor layer 8 is less than $1\times10^{15}$, fabrication of the group III nitride semiconductor layer 8 tends to be difficult. On the other hand, if the carrier concentration of the group III nitride semiconductor layer 8 is more than $1\times10^{19}$, since energy band modulation by an internal electric field is limited to the vicinity of a surface, a quantum efficiency-enhancing effect tends to be lowered.

In the group III nitride semiconductor layer 8, it is preferable that the number of carriers (a product of the thickness and carrier concentration of the group III nitride semiconductor layer 8) per unit area is $1\times10^{10}$ to $2\times10^{14}$ cm$^{-2}$.

For the photoelectric surface 10 of the present embodiment, an internal electric field occurs in the group III nitride semiconductor layer 6 due to, for example, a piezoelectric field caused by distortion or spontaneous polarization in the c-axis direction of the thin film crystal. By the internal electric field, the energy band of the group III nitride semiconductor layer 8 is curved (see FIG. 2). When the group III nitride semiconductor layer 6 is made from AlN and the group III nitride semiconductor layer 8 is made from GaN, it is considered that an electric field of 0.66V/nm is formed due to a difference in the spontaneous polarization coefficient. In this case, if the thickness of the group III nitride semiconductor layer 6 is provided as, for example, 3 nm, a rise in the energy band of 2 eV theoretically occurs in the group III nitride semiconductor layer 8. Note that 1 eV=$1.602\times10^{-9}$ J. When a rise in the energy band occurs, surface potential of the surface 8b of the group III nitride semiconductor layer 8 is modulated. When the ultraviolet rays L are made incident into such a group III nitride semiconductor layer 8, photoelectrons produced in the group III nitride semiconductor layer 8 are easily emitted outside from the group III nitride semiconductor layer 8. Consequently, quantum efficiency of the photoelectric surface 10 can be improved.

In addition, when the photoelectric surface 10 includes the group III nitride semiconductor layer 4, crystal quality of the group III nitride semiconductor layer 6 can be improved compared to when the group III nitride semiconductor layer 6 is directly formed on the substrate 2. When the group III nitride semiconductor layer 4 is thickened, crystal quality of the group III nitride semiconductor layer 6 can further be improved. In addition, layer thickness uniformity and flatness of the group III nitride semiconductor layer 6 are improved. As a result, crystal quality of the group III nitride semiconductor layer 8 can be improved. Consequently, quantum efficiency of the photoelectric surface 10 can further be improved.

Figure 3A:
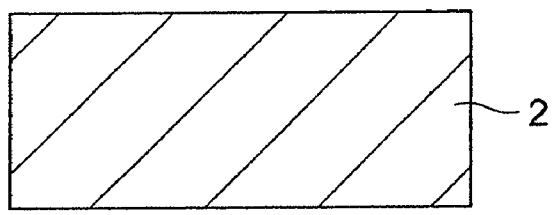
FIG. 3A to FIG. 3D are process sectional views schematically showing an example of a manufacturing method for the photoelectric surface according to the first embodiment, respectively.
Figure 3B:
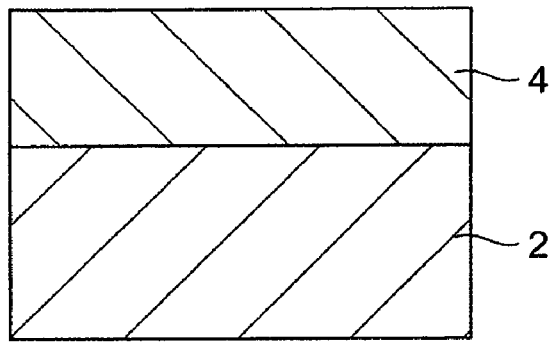
Figure 3C:
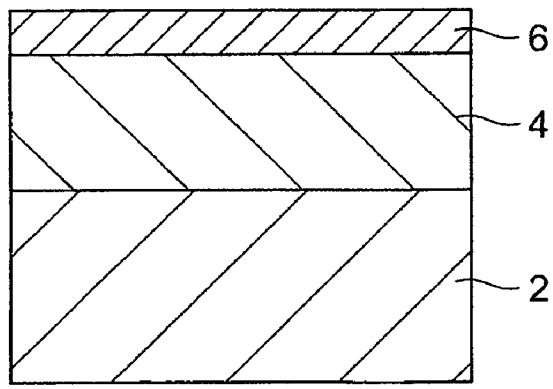
Figure 3D:
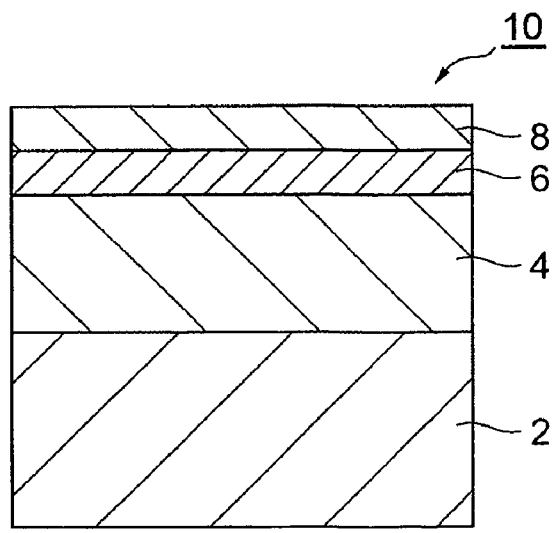

FIG. 3A to FIG. 3D are process sectional views schematically showing an example of a manufacturing method for the photoelectric surface 10, respectively. First, as shown in FIG. 3A, the substrate 2 is prepared. And, as shown in FIG. 3B, the group III nitride semiconductor layer 4 is formed on the substrate 2. Furthermore, as shown in FIG. 3C, the group III nitride semiconductor layer 6 is formed on the group III nitride semiconductor layer 4. Then, as shown in FIG. 3D, the group III nitride semiconductor layer 8 is formed on the group III nitride semiconductor layer 6. The group III nitride semiconductor layers 4, 6, and 8 are formed by epitaxial growth by use of, for example, an MOCVD apparatus. In this manner, the photoelectric surface 10 with a high quantum efficiency is obtained.

Figure 4:
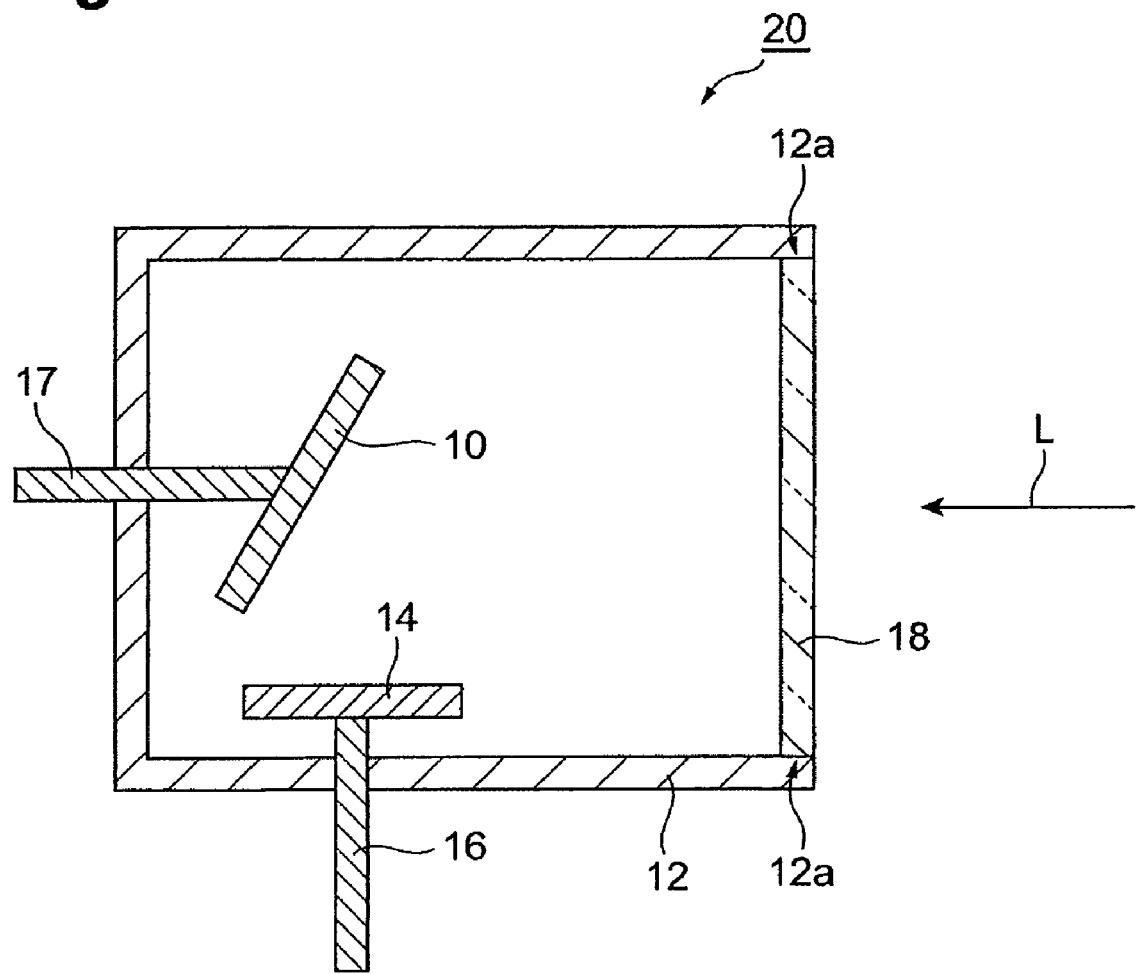
FIG. 4 is a sectional view schematically showing a photodetector according to the first embodiment.

FIG. 4 is a sectional view schematically showing a photodetector according to the present embodiment. A photodetector 20 shown in FIG. 4 includes the photoelectric surface 10 and an anode 14 for extracting photoelectrons emitted from the photoelectric surface 10 as an output signal. The photoelectric surface 10 and anode 14 are arranged in a chamber 12. As the photodetector 20, for example, a phototube or the like can be mentioned.

The interior of the chamber 12 is maintained in a vacuum by use of, for example, a pump. To an end portion 12a of the chamber 12, an entrance window 18 for introducing the ultraviolet rays L into the chamber 12 is connected. By the entrance window 18, the interior of the chamber 12 is sealed. The anode 14 is electrically connected to a lead wire 16. The photoelectric surface 10 is electrically connected to a lead wire 17. In the photodetector 20, since quantum efficiency of the photoelectric surface 10 can be improved, the ultraviolet rays L can be detected at a high sensitivity.

A spontaneous emission of a flame includes short-wavelength ultraviolet rays not included in sunlight or indoor lighting. By using the photodetector 20, the short-wavelength ultraviolet rays can be selectively and efficiently detected. In addition, since the photoelectric surface 10 is formed mainly of a nitride based semiconductor material, photoelectric properties are favorably maintained even in a high-temperature operating environment. Therefore, the photodetector 20 can be favorably used as a flame sensor for a refuse incinerator, a gas range, or the like.

Second Embodiment

Figure 5:
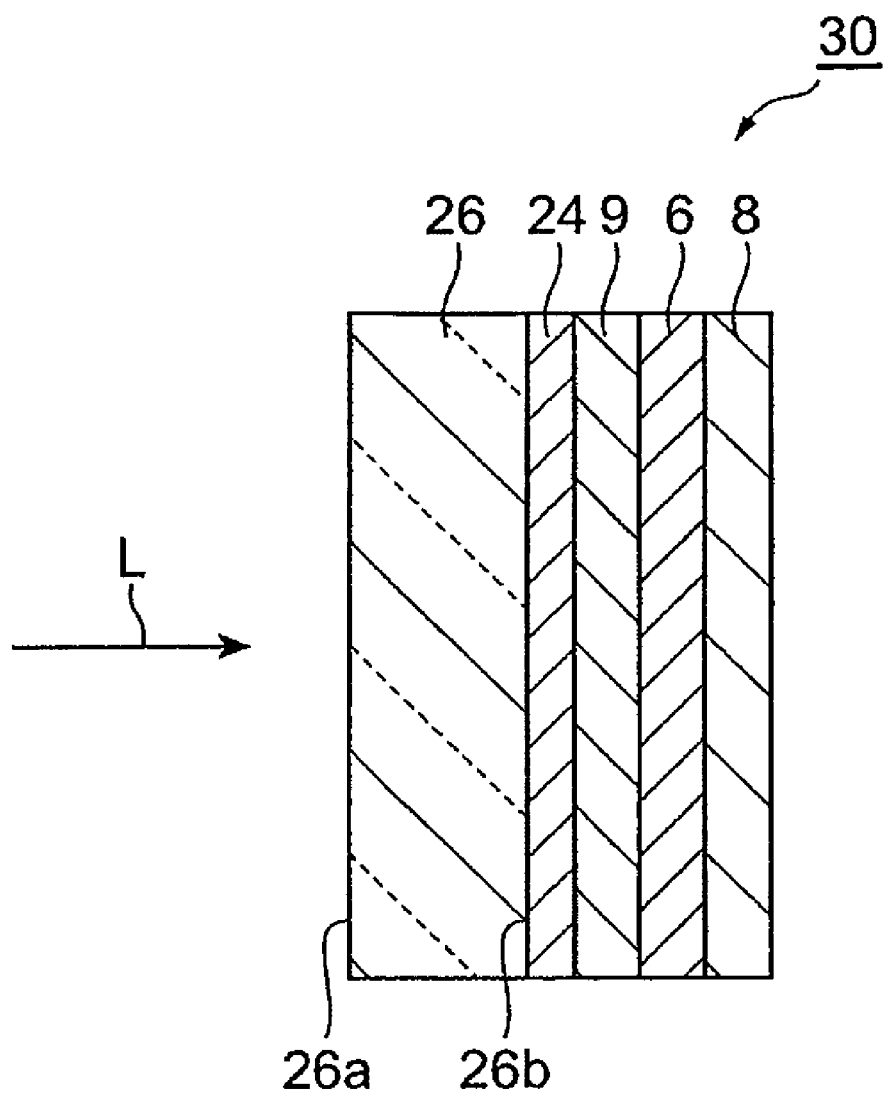
FIG. 5 is a sectional view schematically showing a photoelectric surface according to a second embodiment.

FIG. 5 is a sectional view schematically showing a photoelectric surface according to a second embodiment. In FIG. 5, a transmissive photoelectric surface 30 is shown. The photoelectric surface 30 includes, similar to the photoelectric surface 10, the group III nitride semiconductor layers 6 and 8. Accordingly, in the photoelectric surface 30 as well, quantum efficiency can be improved.

It is preferable that the photoelectric surface 30 further includes a glass substrate 26 into whose one surface 26a ultraviolet rays L are made incident and an adhesive layer 24 provided on the other surface 26b opposed to the surface 26a of the glass substrate 26 and arranged between the glass substrate 26 and group III nitride semiconductor layer 6. Between the group III nitride semiconductor layer 6 and adhesive layer 24, a protective layer 9 for protecting the group III nitride semiconductor layers 6 and 8 may be provided as necessary. The protective layer 9 is made of, for example, a group III nitride semiconductor.

Figure 6A:
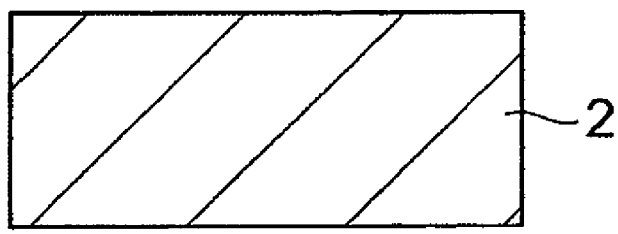
FIG. 6A to FIG. 6C are process sectional views schematically showing an example of a manufacturing method for the photoelectric surface according to the second embodiment, respectively.
Figure 6B:
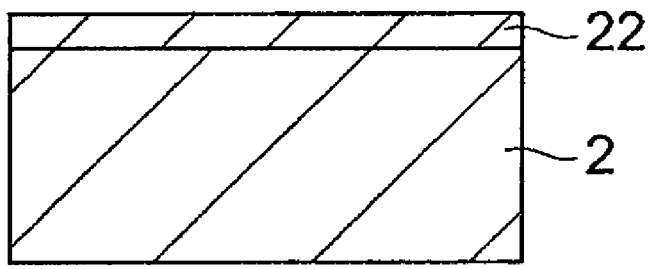
Figure 6C:
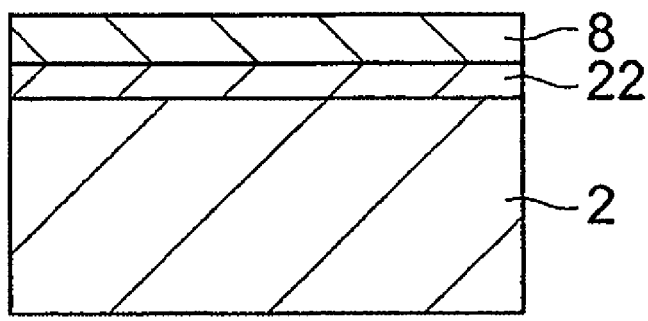
Figure 7A:
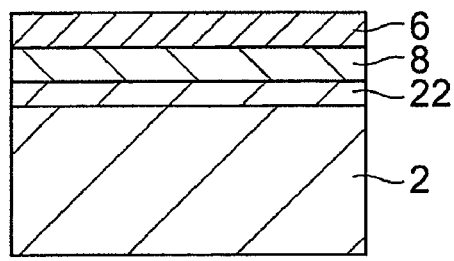
FIG. 7A to FIG. 7E are process sectional views schematically showing an example of a manufacturing method for the photoelectric surface according to the second embodiment, respectively.
Figure 7B:
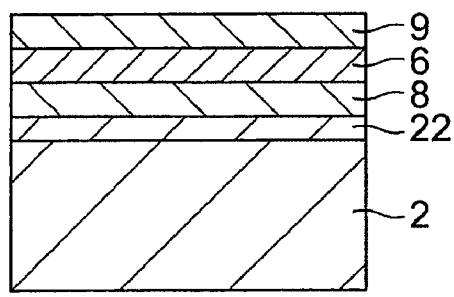
Figure 7C:
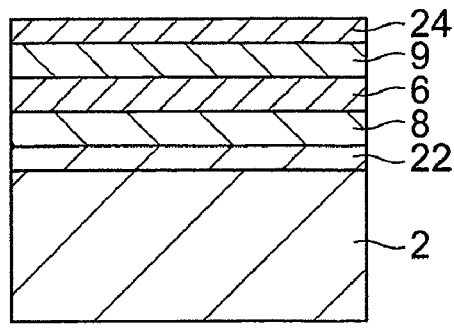
Figure 7D:
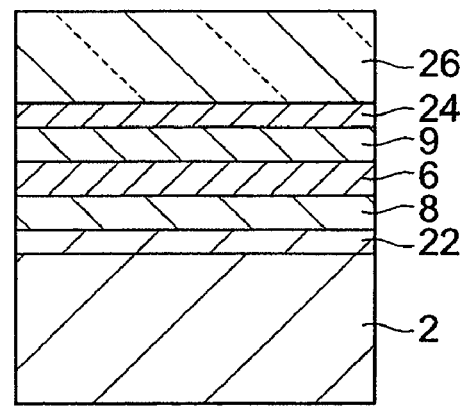
Figure 7E:
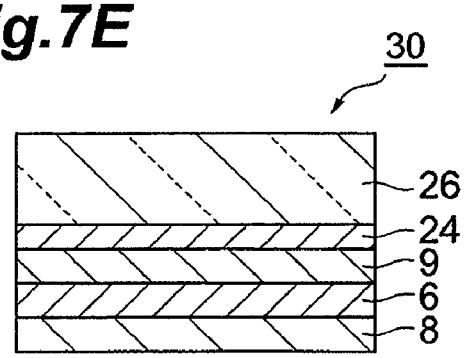

FIG. 6A to FIG. 6C and FIG. 7A to FIG. 7E are process sectional views schematically showing an example of a manufacturing method for the photoelectric surface 30, respectively. First, as shown in FIG. 6A, the substrate 2 is prepared. And, as shown in FIG. 6B, a buffer layer 22 is formed on the substrate 2. By use of, for example, an MOCVD apparatus, the buffer layer 22 can be formed on the substrate 2. Furthermore, as shown in FIG. 6C, the group III nitride semiconductor layer 8 is on the buffer layer 22. Then, as shown in FIG. 7A, the group III nitride semiconductor layer 6 is formed on the group III nitride semiconductor layer 8. Next, as shown in FIG. 7B, the protective layer 9 is formed on the group III nitride semiconductor layer 6 as necessary. The group III nitride semiconductor layers 6 and 8 and protective layer 9 are formed by epitaxial growth by use of, for example, an MOCVD apparatus. Next, as shown in FIG. 7C, the adhesive layer 24 is formed on the protective layer 9. Next, as shown in FIG. 7D, the glass substrate 26 is placed on the adhesive layer 24. Then, by removing the substrate 2 and buffer layer 22 by, for example, wet etching, the photoelectric surface 30 shown in FIG. 7E is obtained.

Figure 8:
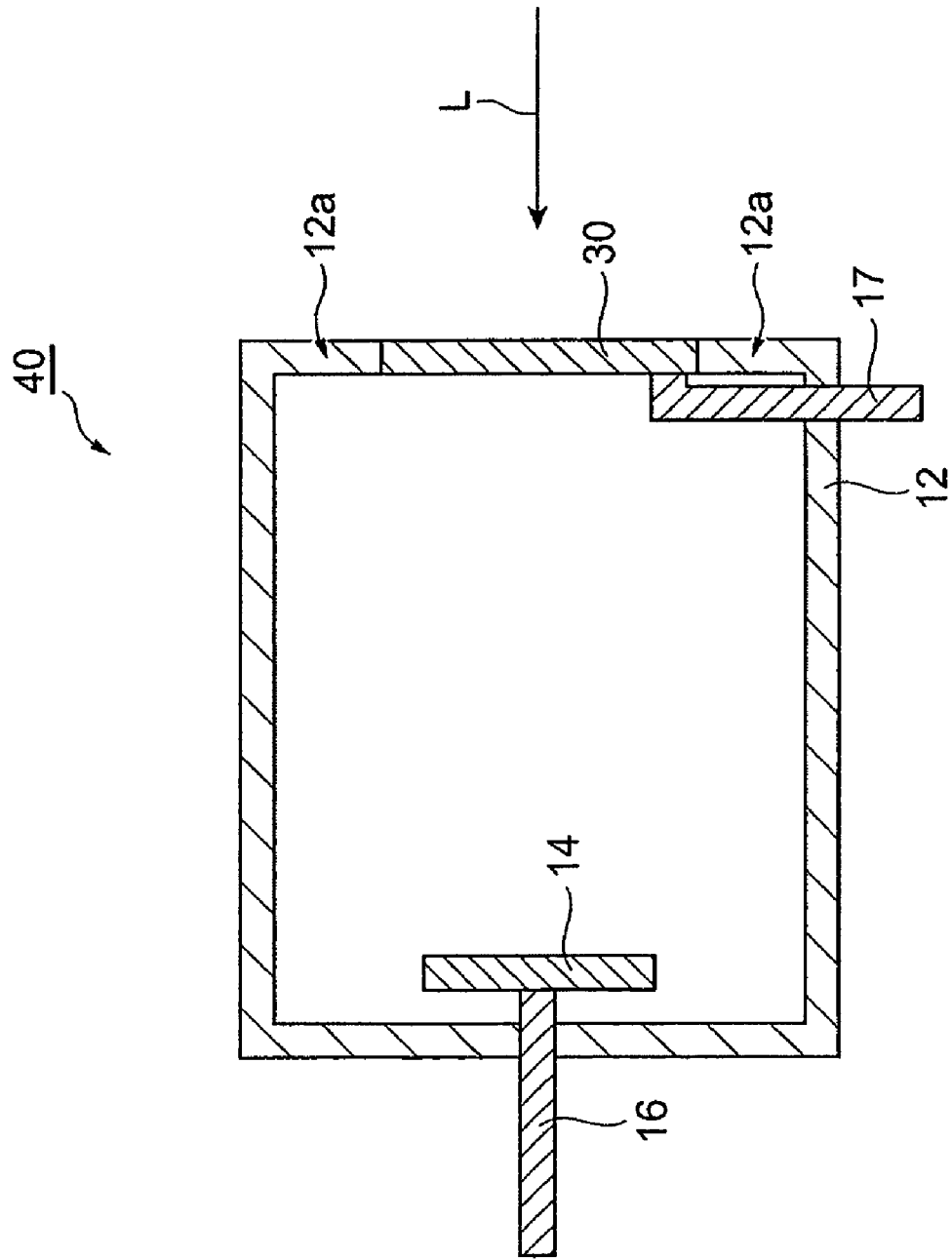
FIG. 8 is a sectional view schematically showing a photodetector according to the second embodiment.

FIG. 8 is a sectional view schematically showing a photodetector according to the present embodiment. A photodetector 40 shown in FIG. 8 includes the photoelectric surface 30 and the anode 14 for extracting photoelectrons emitted from the photoelectric surface 30 as an output signal. The anode 14 is arranged in the chamber 12. As the photodetector 40, for example, a phototube or the like can be mentioned.

The interior of the chamber 12 is maintained in a vacuum by use of, for example, a pump. To the end portion 12a of the chamber 12, the photoelectric surface 30 into which the ultraviolet rays L are made incident is connected. By the photoelectric surface 30, the interior of the chamber 12 is sealed. The anode 14 is electrically connected to the lead wire 16. The photoelectric surface 30 is electrically connected to the lead wire 17. In the photodetector 40, since quantum efficiency of the photoelectric surface 30 can be improved, the ultraviolet rays L can be detected at a high sensitivity.

Moreover, since use of the photodetector 40 allows two-dimensional imaging, refuse can be efficiently disposed of in, for example, a refuse incinerator. As a result, dioxin emissions can be suppressed.

In the above, preferred embodiments of the present invention have been described in detail, however, the present invention is by no means limited to the embodiments described above.

Hereinafter, the present invention will be described in greater detail based on examples and comparative examples, however, the present invention is not limited to the following examples.

Example 1

First, a GaN base layer (group III nitride semiconductor layer 4) having a thickness of 600 nm was formed on a sapphire substrate (substrate 2). Furthermore, under a reduced pressure (76 Torr), an AlN layer (group III nitride semiconductor layer 6) having a thickness of 100 nm was formed on the GaN base layer. Note that 1 Torr=133.322 Pa. Thereafter, a GaN active layer (group III nitride semiconductor layer 8) having a thickness of 200 nm was formed on the AlN layer. In this manner, a photoelectric surface of Example 1 was obtained.

Example 2

Except that the thickness of the AlN layer was provided as 50 nm and the thickness of the GaN active layer was provided as 100 nm, in the same manner as in Example 1, a photoelectric surface of Example 2 was obtained.

Comparative Example 1

After a GaN buffer layer having a thickness of 20 nm was formed on a sapphire substrate, a GaN active layer having a thickness of 300 nm was formed on the GaN buffer layer. In this manner, a photoelectric surface of Comparative Example 1 was obtained.

Evaluation Results

Quantum efficiency in relation to each wavelength was measured for the photoelectric surfaces of Examples 1 and 2 and Comparative Examples 1.

Figure 9:
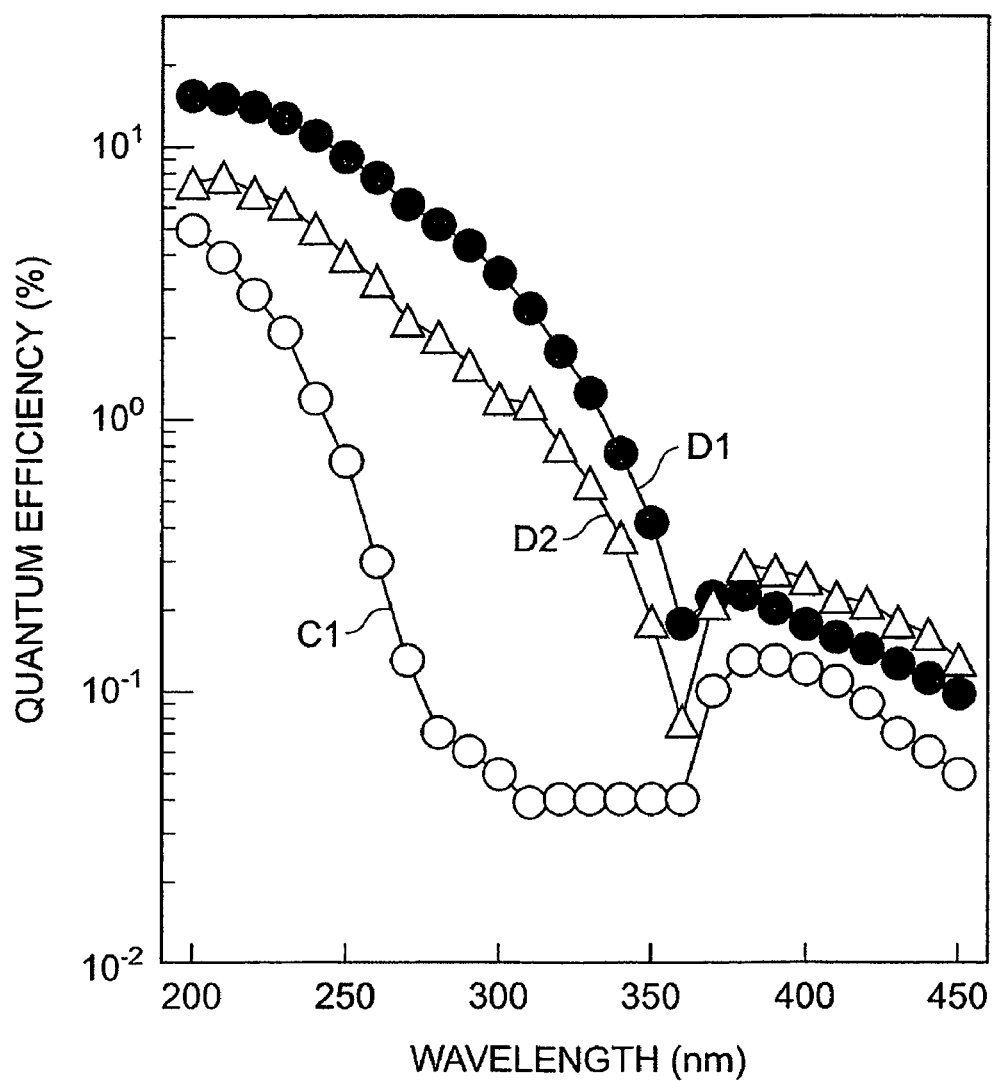
FIG. 9 is a graph showing a relationship between the wavelength of ultraviolet rays made incident into a photoelectric surface and quantum efficiency of the photoelectric surface.

FIG. 9 is a graph showing a relationship between the wavelength of ultraviolet rays made incident into a photoelectric surface and quantum efficiency of the photoelectric surface. The horizontal axis of the graph shows a wavelength (nm) of ultraviolet rays. The vertical axis of the graph shows quantum efficiency (%) of a photoelectric surface. In the graph of FIG.

9, data D1 and D2 show measurement results of Examples 1 and 2, respectively, and data C1 shows a measurement result of Comparative Example 1. It is understood from the graph that quantum efficiency of the photoelectric surface of Examples 1 and 2 is higher than that of Comparative Example 1. This indicates that such an electric field that electrons photoexcited on the surface (surface 8b) by depletion in the vicinity of the AlN layer-side surface (surface 8b) of the GaN active layer are accelerated toward the surface (surface 8a) has been formed.

Figure 10:
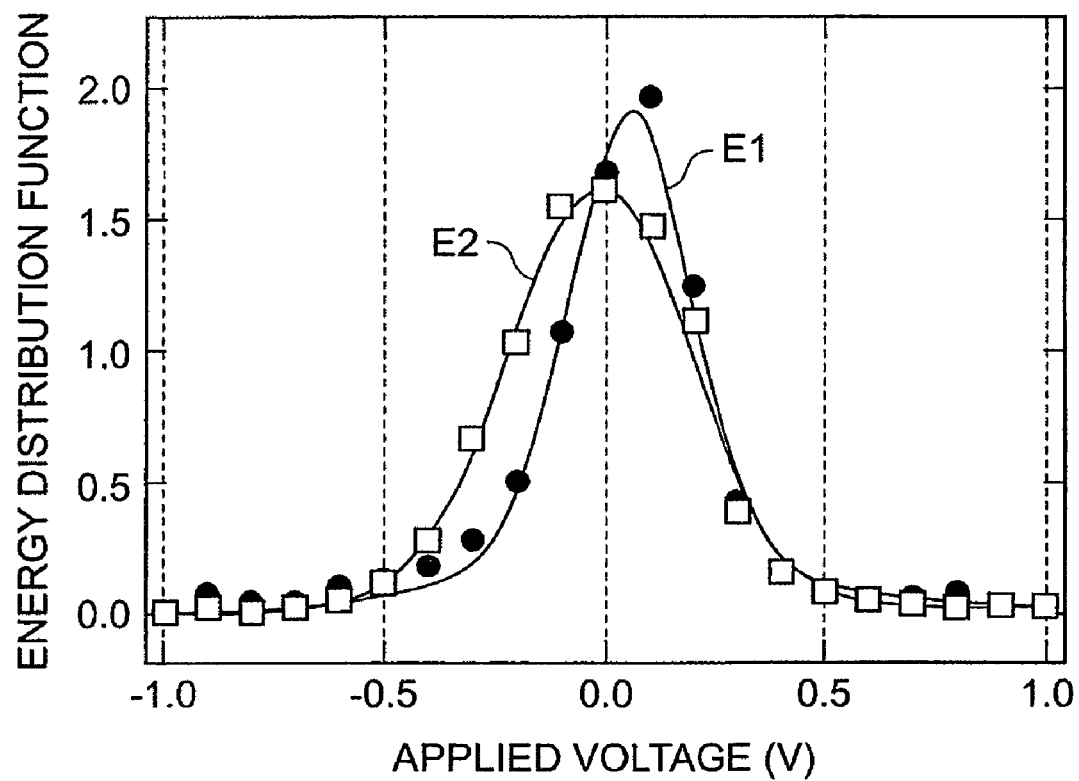
FIG. 10 is a graph showing a relationship between the energy distribution function and applied voltage.

FIG. 10 is a graph showing a relationship between the energy distribution function and applied voltage. The horizontal axis of the graph shows an applied voltage (V). The vertical axis of the graph shows an energy distribution function (relative value). The energy distribution function is obtained by differentiating a photocurrent obtained when an extraction voltage is provided as −10V to +20V by use of a low-pressure mercury lamp that provides a 10 mm-diameter circle with energy of 1 μW. Data E1 shows a measurement result of a GaN thin film having a thickness of 300 nm whose front surface is a Ga surface. Data E2 shows a measurement result of a GaN thin film having a thickness of 300 nm whose front surface is an N surface. In the data E1, it shows a peak at +0.1V, while in the data E2, it shows a peak at −1.0 to 0V. Therefore, it is understood that the GaN thin film whose front surface is an N surface more easily emits photoelectrons. When the GaN thin film whose front is an N surface and the GaN thin film whose from surface is a Ga surface both have the same photoelectron emission rate, the difference in the peak position indicates a difference in the surface potential barrier. By a calculation without regard for the surface level, since holes are accumulated in the Ga surface, the difference in the surface potential between the Ga surface and N surface equals 3 eV. However, in actuality, accumulation of holes in the Ga surface is replaced by accumulation of positive electric charges at the surface level, and does not become such a great difference as 3 eV.

As has been described above, according to the present invention, a photoelectric surface that is high in photon efficiency and a photodetector using the same are provided.

What is claimed is:

1. A photoelectric surface comprising:
a first group III nitride semiconductor layer that produces photoelectrons according to incidence of ultraviolet rays; and
a second group III nitride semiconductor layer provided adjacent to the first group III nitride semiconductor layer and made of a thin-film crystal having c-axis orientation in a thickness direction, the second group III nitride semiconductor layer having an Al composition higher than that of the first group III nitride semiconductor layer,
wherein the thickness of the first group III nitride semiconductor layer is 100 to 200 nm.

2. A photodetector comprising:
the photoelectric surface according to claim 1; and
an anode for extracting photoelectrons emitted from the photoelectric surface as an output signal.

3. A photoelectric surface comprising:
a first group III nitride semiconductor layer that produces photoelectrons according to incidence of ultraviolet rays; and
a second group III nitride semiconductor layer provided adjacent to the first group III nitride semiconductor layer and are polarized in a thickness direction,
wherein the thickness of the first group III nitride semiconductor layer is 100 to 200 nm.

4. A photodetector comprising:
the photoelectric surface according to claim 3; and
an anode for extracting photoelectrons emitted from the photoelectric surface as an output signal.

5. A photodetector comprising:
a chamber whose interior is maintained in a vacuum;
a photoelectric surface arranged in the chamber, the photoelectric surface comprising:
a first group III nitride semiconductor layer that produces photoelectrons according to incidence of ultraviolet rays; and
a second group III nitride semiconductor layer provided adjacent to the first group III nitride semiconductor layer and made of a thin-film crystal having c-axis orientation in a thickness direction, the second group III nitride semiconductor layer having an Al composition higher than that of the first group III nitride semiconductor layer;
an entrance window for introducing the ultraviolet rays, the entrance window being connected to the chamber;
an anode for extracting photoelectrons emitted from the photoelectric surface as an output signal, the anode being arranged in the chamber.

6. The photodetector according to claim 5, the photoelectric surface further comprising a third group III nitride semiconductor layer, wherein the second group III nitride semiconductor layer is provided on the third group III nitride semiconductor layer.

7. The photodetector according to claim 5, the photoelectric surface further comprising:
a glass substrate into whose one surface ultraviolet rays are made incident; and
an adhesive layer provided on the other surface opposed to the surface of the glass substrate and arranged between the glass substrate and the second group III nitride semiconductor layer.

8. A photodetector comprising:
a chamber whose interior is maintained in a vacuum;
a photoelectric surface arranged in the chamber, the photoelectric surface comprising:
a first group III nitride semiconductor layer that produces photoelectrons according to incidence of ultraviolet rays; and
a second group III nitride semiconductor layer provided adjacent to the first group III nitride semiconductor layer and are polarized in a thickness direction;
an entrance window for introducing the ultraviolet rays, the entrance window being connected to the chamber;
an anode for extracting photoelectrons emitted from the photoelectric surface as an output signal, the anode being arranged in the chamber.

9. The photodetector according to claim 8, the photoelectric surface further comprising a third group III nitride semiconductor layer, wherein the second group III nitride semiconductor layer is provided on the third group III nitride semiconductor layer.

10. The photodetector according to claim 8, the photoelectric surface further comprising:
a glass substrate into whose one surface ultraviolet rays are made incident; and
an adhesive layer provided on the other surface opposed to the surface of the glass substrate and arranged between the glass substrate and the second group III nitride semiconductor layer.

* * * * *